US012656424B2

(12) United States Patent
Xing et al.

(10) Patent No.: US 12,656,424 B2
(45) Date of Patent: Jun. 16, 2026

(54) EXAMINATION ROOM SHILEDS AND IMAGING SYSTEMS

(71) Applicant: SHANGHAI UNITED IMAGING HEALTHCARE CO., LTD., Shanghai (CN)

(72) Inventors: Tuota Xing, Shanghai (CN); Feichao Fu, Shanghai (CN); Haoshan Zhu, Shanghai (CN); Kangkang Sha, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 173 days.

(21) Appl. No.: 18/434,778

(22) Filed: Feb. 6, 2024

(65) Prior Publication Data

US 2024/0264252 A1     Aug. 8, 2024

(30) Foreign Application Priority Data

Feb. 7, 2023    (CN) .......................... 202310096372.8

(51) Int. Cl.
G01R 33/28        (2006.01)
G01R 33/00        (2006.01)

(52) U.S. Cl.
CPC ....... G01R 33/288 (2013.01); G01R 33/0047 (2013.01); G01R 33/0076 (2013.01)

(58) Field of Classification Search
CPC .............. G01R 33/288; G01R 33/0047; G01R 33/0076; G01R 33/422; A61B 5/055; A61N 5/10
USPC ......................................................... 324/307
See application file for complete search history.

(56) References Cited

U.S. PATENT DOCUMENTS

| | | | | | |
|---|---|---|---|---|---|
| 5,986,531 | A | * | 11/1999 | Carrozzi | .............. G01R 33/422 |
| | | | | | 324/318 |
| 10,006,975 | B2 | * | 6/2018 | Ohgishi | ................. G09G 3/344 |
| 10,012,711 | B2 | * | 7/2018 | Rapoport | ............... A61B 5/055 |
| 10,495,704 | B2 | * | 12/2019 | Rapoport | ............. G01R 33/422 |
| 10,524,690 | B2 | * | 1/2020 | Rapoport | ............... A61B 5/704 |
| 10,568,538 | B2 | * | 2/2020 | Rapoport | ............... A61B 5/704 |
| 11,287,497 | B2 | * | 3/2022 | Rapoport | ............. G01R 33/383 |
| 2016/0106317 | A1 | | 4/2016 | Overweg et al. | |

OTHER PUBLICATIONS

Ridgway, John P. "The MRI environment." Cardiovascular MR Manual. Cham: Springer International Publishing, 2015. 11-15. (Year: 2015).*

* cited by examiner

*Primary Examiner* — Christopher P Mcandrew
(74) *Attorney, Agent, or Firm* — METIS IP LLC

(57)        ABSTRACT
Embodiments of the present disclosure disclose an examination room shield, comprising: a peripherally closed shield side wall, and a sub-shield assembly disposed in an inner space enclosed by the shield side wall, the sub-shield assembly including a peripherally closed sub-shield side wall.

20 Claims, 7 Drawing Sheets

<u>20</u>

100

<u>20</u>

100

100

20

60

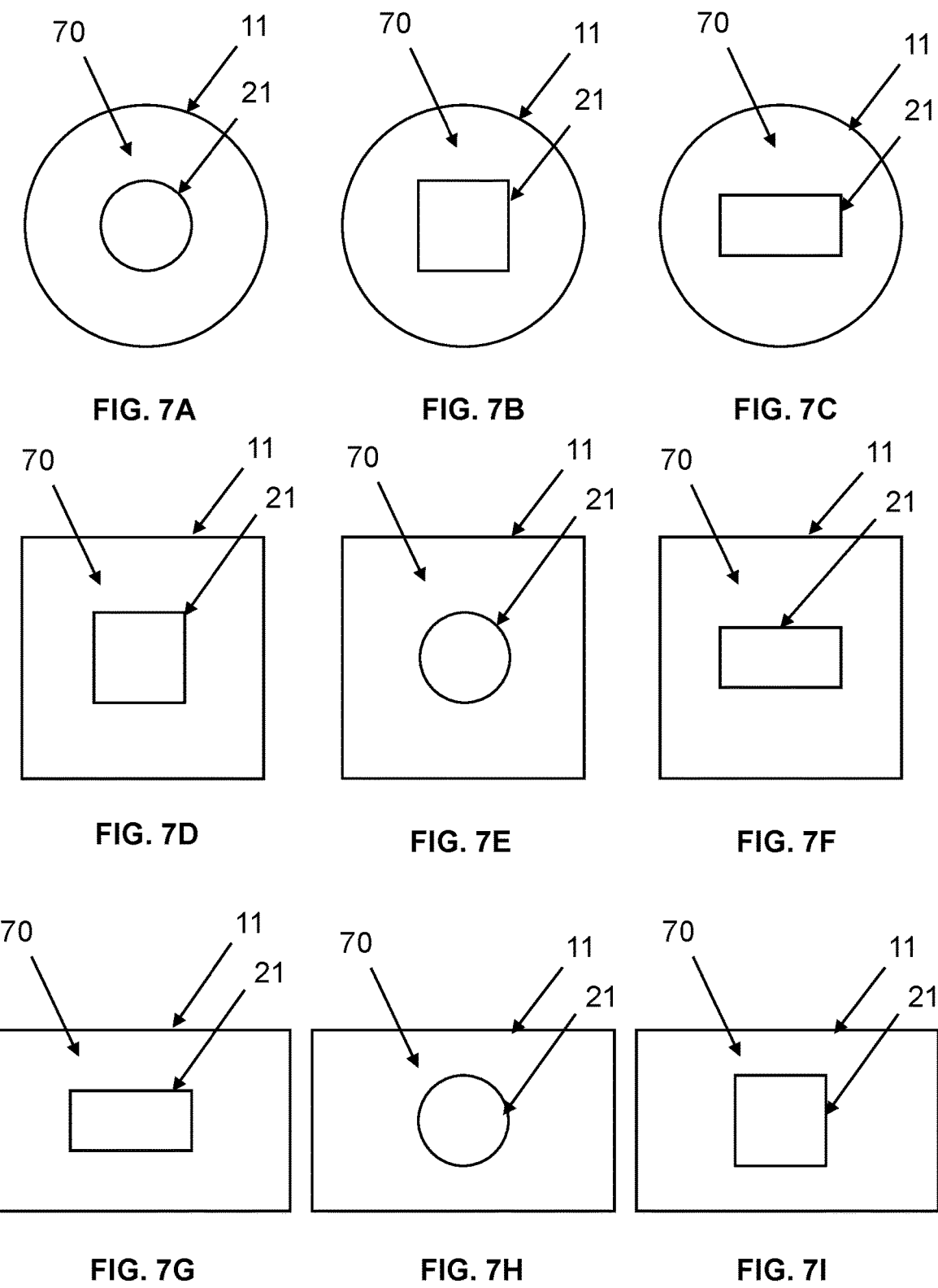
FIG. 7A                    FIG. 7B                    FIG. 7C
FIG. 7D                    FIG. 7E                    FIG. 7F
FIG. 7G                    FIG. 7H                    FIG. 7I

EXAMINATION ROOM SHILEDS AND IMAGING SYSTEMS

CROSS-REFERENCE TO RELATED APPLICATIONS

This application claims priority to Chinese Patent Application No. CN202310096372.8, filed on Feb. 7, 2023, the entire contents of which are hereby incorporated by reference.

TECHNICAL FIELD

The present disclosure relates to the technical field of a medical device and, in particular, to an examination room shield and an imaging system.

BACKGROUND

Magnetic resonance imaging (MRI) is a technique for imaging any cross-section of a human body using a non-invasive nuclear magnetic method that utilizes nuclei of atoms. The term "nucleus" refers to the nucleus of the hydrogen atom. Since the human body is composed of about 70% water, MRI relies on hydrogen atoms in water for imaging, i.e., the human body is placed in a special magnetic field, and the hydrogen nuclei in the body are excited by radio frequency pulses, which causes the hydrogen nuclei to resonate and absorb energy. After the radio frequency pulses are stopped, the hydrogen nuclei emit radio signals at a specific frequency and release the absorbed energy, which is recorded by a receiver outside the body and processed by a computer to produce an image. The weak electrical signals emitted by the hydrogen atoms during this process make them susceptible to external interference (e.g., electromagnetic interference) and therefore place high demands on the construction of the MRI examination room. Electromagnetic shield becomes even more complicated when an imaging device is used in an examination room with an additional device. The operation of the additional device will cause electromagnetic interference to the imaging device.

Therefore, there is a need to provide an examination room shield and an imaging system that shield electromagnetic interference generated by the additional device and signal interference from outside in order to ensure that the imaging device operates in a space free of electromagnetic interference, thereby obtaining a high imaging quality.

SUMMARY

One embodiment of the present disclosure provides an examination room shield, comprising: a peripherally closed shield side wall, and a sub-shield assembly disposed in an inner space enclosed by the shield side wall, the sub-shield assembly including a peripherally closed sub-shield side wall.

In some embodiments, the examination room shield further comprises: a shield top plate corresponding to the shield side wall.

In some embodiments, the sub-shield assembly further includes a hollow sub-shield.

In some embodiments, the sub-shield side wall is provided with an opening, and the sub-shield is hermetically connected to the opening.

In some embodiments, a hollow space in the sub-shield is used to install a magnetic resonance imaging (MRI) device.

In some embodiments, the sub-shield assembly is used to install an additional device, the additional device being located on an outside of the sub-shield.

In some embodiments, the additional device includes a radiotherapy device.

In some embodiments, the operating room is a connected space and provided with an annular passage.

In some embodiments, a peripherally closed space is formed between the shield side wall and the sub-shield side wall used as an operating room for the MRI device.

In some embodiments, the sub-shield side wall is peripherally closed to form a cylindrical profile, a cubic profile, or a cuboid profile; and/or the shield side wall is peripherally closed to form a cylindrical profile, a cubic profile, or a cuboid profile.

In some embodiments, at least one side lateral to the shield side wall or the sub-shield side wall is provided with a movable door.

In some embodiments, an additional device surrounded by the sub-shield side wall incudes a first surface and a second surface, and a direction between the first surface and the second surface is vertical to a rotation axis of the additional device; and a first movable door on the sub-shield side wall is located corresponding to the first surface or the second surface of the addition device.

In some embodiments, the sub-shield side wall is disposed with two first movable doors located corresponding to the first surface and the second surface of the additional device, respectively.

In some embodiments, a second movable door on the shield side wall and the first movable door on the sub-shield side wall are located in a same direction relative to the additional device.

In some embodiments, the sub-shield is a housing for a MRI device.

In some embodiments, the examination room shield further comprises a shield base plate, the shield side wall and the sub-shield side wall being hermetically connected to the shield base plate, respectively.

One embodiment of the present disclosure provides an imaging system, comprising: a peripherally closed shield side wall; a sub-shield assembly disposed in an inner space enclosed by the shield side wall, the sub-shield assembly including a peripherally closed shaped sub-shield side wall; and an imaging device installed in a hollow space of the sub-shield assembly.

In some embodiments, the sub-shield assembly further includes a sub-shield with the hollow space therein.

In some embodiments, the shield side wall and the sub-shield side wall form a connected space that is peripherally closed and used as an operating room for the imaging device.

In some embodiments, the examination room shield further comprises a shield base plate, the shield side wall and the sub-shield side wall being hermetically connected to the shield base plate, respectively.

BRIEF DESCRIPTION OF THE DRAWINGS

This description will be further explained in the form of exemplary embodiments, which will be described in detail by means of accompanying drawings. These embodiments are not restrictive, in which the same numbering indicates the same structure, wherein:

FIG. 7A is an exemplary top diagram illustrating a shield side wall and a sub-shield side wall according to some embodiments of the present specification;

FIG. 7B is an exemplary top diagram illustrating a shield side wall and a sub-shield side wall according to yet some more embodiments of the present specification;

FIG. 7C is an exemplary top diagram illustrating a shield side wall and a sub-shield side wall according to yet some more embodiments of the present specification;

FIG. 7D is an exemplary top diagram illustrating a shield side wall and a sub-shield side wall according to yet some more embodiments of the present specification;

FIG. 7E is an exemplary top diagram illustrating a shield side wall and a sub-shield side wall according to yet some more embodiments of the present specification;

FIG. 7F is an exemplary top diagram illustrating a shield side wall and a sub-shield side wall according to yet some more embodiments of the present specification;

FIG. 7G is an exemplary top diagram illustrating a shield side wall and a sub-shield side wall according to yet some more embodiments of the present specification;

FIG. 7H is an exemplary top diagram illustrating a shield side wall and a sub-shield side wall according to yet some more embodiments of the present specification; and FIG. 7I is an exemplary top diagram illustrating a shield side wall and a sub-shield side wall according to yet some more embodiments of the present specification.

Figure 1:
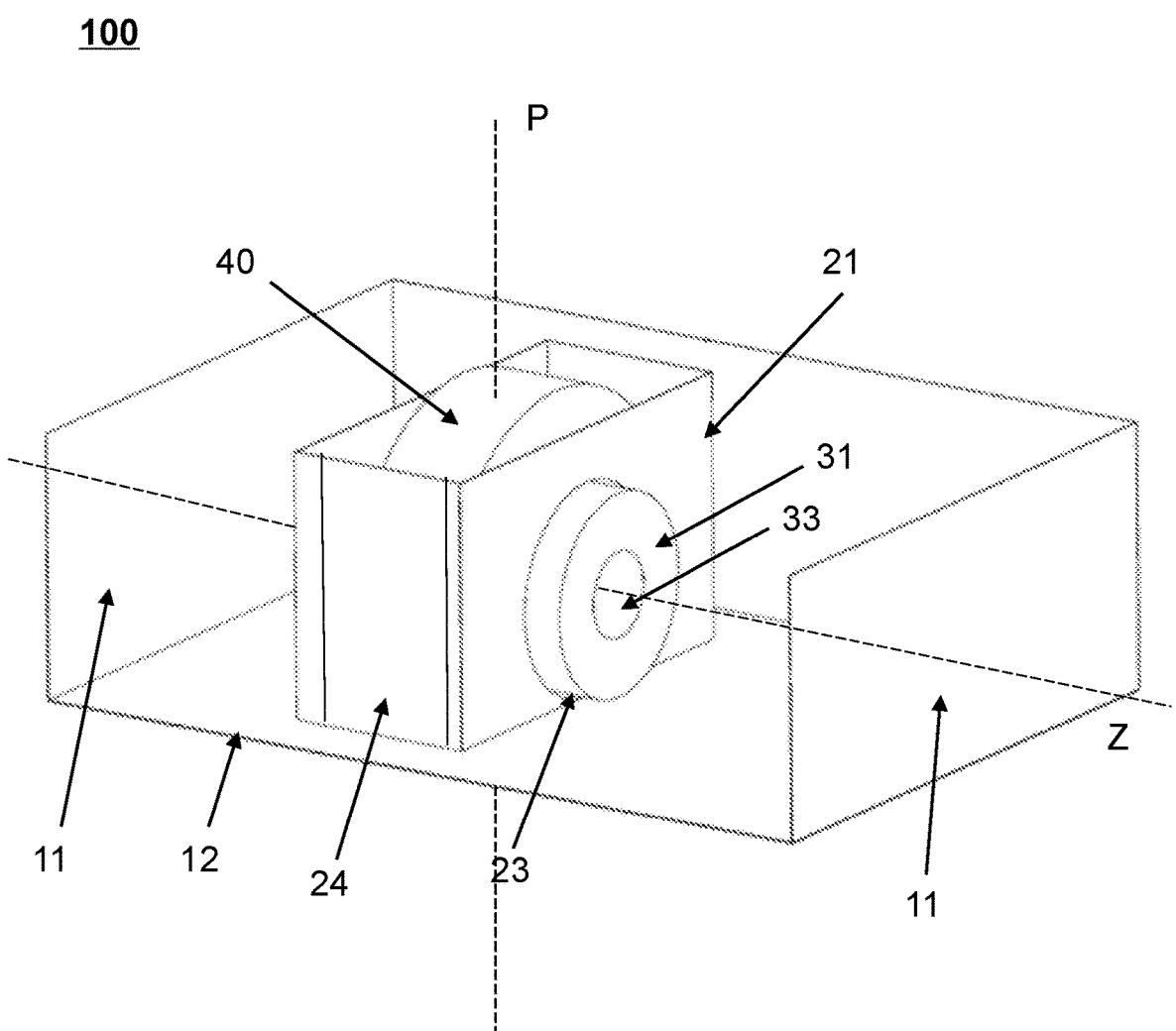
FIG. 1 is an exemplary structural diagram illustrating an examination room shield according to some embodiments of the present disclosure.

The correspondence of each of the reference numerals in the figures to the components is as follows: 100, examination room shield; 10, first shield space; 11, shield side wall; 11-1, first shield surface; 11-2, second shield surface; 11-3, third shield surface; 11-4, fourth shield surface; 12, shield base plate; 13, second movable door; 20, sub-shield assembly; 21, sub-shield side wall; 21-1, first sub-shield surface; 21-2, second sub-shield surface; 21-3, third sub-shield surface; 21-4, fourth sub-shield surface; 22, sub-shield; 23, opening; 24, first movable door; 25, side wing; 30, magnetic resonance imaging device; 31, main magnet; 32, movable bed; 33, bore; 40, additional device; 40-1, first surface; 40-2, second surface; 50, connection member; 50-1, first folded edge; 50-2, second folded edge; 60, second shield space; and 70, a connected space that is peripherally closed.

DETAILED DESCRIPTION

The technical schemes of embodiments of the present disclosure will be more clearly described below, and the accompanying drawings need to be configured in the description of the embodiments will be briefly described below. Obviously, the drawings in the following description are merely some examples or embodiments of the present disclosure, and will be applied to other similar scenarios according to these accompanying drawings without paying creative labor. Unless obviously obtained from the context or the context illustrates otherwise, the same numeral in the drawings refers to the same structure or operation.

It should be understood that the "system", "device", "unit" and/or "module" used herein is a method for distinguishing different components, elements, components, parts or assemblies of different levels. However, if other words may achieve the same purpose, the words may be replaced by other expressions.

As shown in the present disclosure and claims, unless the context clearly prompts the exception, "a", "one", and/or "the" is not specifically singular, and the plural may be included. It will be further understood that the terms "comprise," "comprises," and/or "comprising," "include," "includes," and/or "including," when used in present disclosure, specify the presence of stated features, integers, steps, operations, elements, and/or components, but do not preclude the presence or addition of one or more other features, integers, steps, operations, elements, components, and/or groups thereof.

The flowcharts are used in present disclosure to illustrate the operations performed by the system according to the embodiment of the present disclosure. It should be understood that the preceding or following operations is not necessarily performed in order to accurately. Instead, the operations may be processed in reverse order or simultaneously. Moreover, one or more other operations may be added to the flowcharts. One or more operations may be removed from the flowcharts.

Some imaging devices need to work without interference. Exemplarily, a magnetic resonance imaging (MRI) device needs to work without electromagnetic interference. Conventional radiofrequency (RF) shield is a regular hexahedral cube that encases the MRI device inside the shield. When the MRI device is used in an examination room with an additional device, e.g., a radiation therapy device (RT) to be used in the examination room, the operation of the additional device generates electromagnetic interference to the MRI device. Therefore, it is necessary to improve the examination room shield to shield electromagnetic interference generated by the additional device to ensure that the MRI device operates in a space with on electromagnetic interference or very weak electromagnetic interference.

Some embodiments of the present disclosure provide an examination room shield and an imaging system. The examination room shield includes: a peripherally closed shield side wall, a shield top plate corresponding to the shield side wall, and a sub-shield assembly disposed in an inner space enclosed by the shield side wall. The sub-shield assembly includes a peripherally closed sub-shield side wall and a hollow sub-shield. The hollow space of the sub-shield is used for installing an MRI device, and the sub-shield assembly is used within the sub-shield assembly for installing an additional device. The examination room shield has good shielding, not only wrapping the MRI device inside a shield space formed by the shield side wall and the shield top plate, effectively preventing signal interference to the MR device from outside the examination room, but also effectively preventing signal interference to the MR device from outside the examination room. Moreover, the examination room wraps the additional device inside a shield space formed by the sub-shield side wall and the sub-shield, shielding electromagnetic interference generated by the additional device to ensure that the MRI device operates in a space free of electromagnetic interference. In some embodiments, the shield side wall and the sub-shield side wall are spaced apart so that a connected annular operation space is formed between the shield side wall and the sub-shield side wall, so that the operation space for an operator (e.g., a doctor, a technician, or an engineer) within the examination room is larger, the walkways are more numerous, and the operator may quickly respond to an unexpected condition of a patient during operation (for example, it is possible to walk quickly from the left or right side lateral to the patient to the head position, and multiple walkways allow multiple operators to walk at the same time, avoiding the phenomenon of multiple collisions in emergency situations).

It can be understood that the imaging device and the additional device may be the same device or different devices. The imaging device may be a medical device other than the MRI device, and the following is mainly illustrated with the example of the imaging device being the MRI device.

FIG. 1 is an exemplary structural diagram illustrating an examination room shield according to some embodiments of the present disclosure.

In some embodiments, as shown in FIG. 1, the examination room shield 100 may include: a peripherally closed shield side wall 11, a shield top plate (not shown in the figure) corresponding to the shield side wall 11, and a sub-shield assembly 20 disposed in an inner space enclosed by the shield side wall 11. As used in the present disclosure, the peripheral closure means that an object encloses a continuous and complete closed loop at 360 degrees, with no gaps or interruptions. For example, front, back, left and right sides lateral to a cube are formed by four squares that meet head to tail, and these four squares may be referred to as a peripherally closed side wall of the cube. As another example, a cylinder has a cylindrical surface that is a curved surface, and the cylindrical surface may also be referred to as a peripherally closed side wall of the cylinder. Merely by way of example, the peripherally closed shield side wall 11 shown in FIG. 1 includes four rectangles connected head to tail, only three of which are shown in FIG. 1 for the sake of clearly illustrating the internal sub-shield assembly 20.

The shield side wall 11 is a shield around an outermost perimeter of the examination room shield. The shield side wall 11 may be used to limit external electromagnetic interference from entering the interior of the MRI device and to reduce the impact of electromagnetic radiation generated by the MRI device on the external environment. In some embodiments, the material of the shield side wall 11 may 11 may include copper foil or galvanized steel. The shield side wall 11 made of this material produces a Faraday cage effect, resulting in good signal shielding. In some embodiments, the shield side wall 11 may be a side wall of the examination room or a shield independent of the side wall of the examination room (e.g., the shield side wall 11 may be a shield embedded in the side wall of the examination room).

Figure 5:
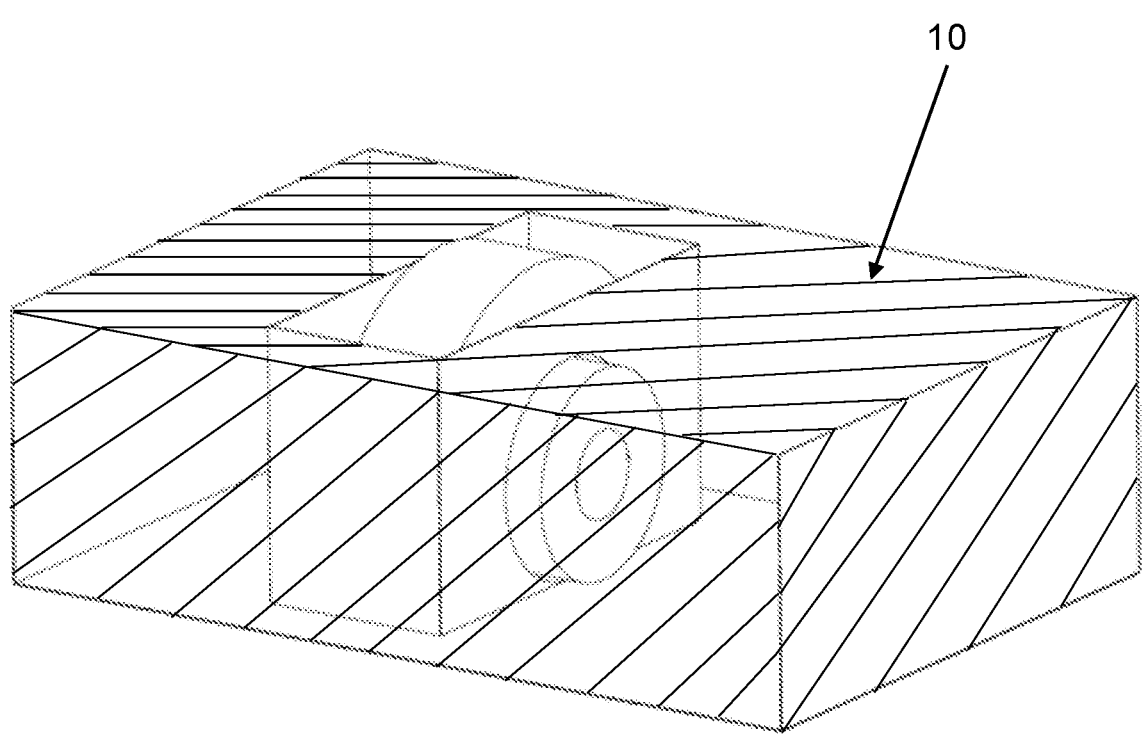
FIG. 5 is an exemplary structural diagram illustrating a first shield space according to some embodiments of the present disclosure.

The shield top plate is a shield above the outermost perimeter of the examination room shield. The shield top plate serves a similar purpose and is made of similar materials to the shield side wall 11 and is not described herein. In some embodiments, the shape of a surface of the shield top plate facing the shield side wall 11 is the same as the shape of a cross-section of the shield side wall 11. The cross-section of the shield side wall 11 is a cross-section perpendicular to a direction P (e.g., a direction vertical to the ground) of the shield side wall 11 shown in FIG. 1. For example, when the cross-section of the shield side wall 11 is circular or oval (e.g., the shield side wall 11 is peripherally closed to form a cylinder), the shape of the surface of the shield top plate facing the shield side wall 11 is circular or oval. As another example, when the cross-section of the shield side wall 11 is square (e.g., the shield side wall 11 is peripherally closed to form a cubic), the shape of the surface of the shield top plate facing the shield side wall 11 is square. As still another example, when the cross-section of the shield side wall 11 is rectangular (e.g., the shield side wall 11 is peripherally closed to form a cuboid), the shape of the surface of the shield top plate facing the shield side wall 11 is rectangular. In some embodiments, the shape of the surface of the shield top plate facing the shield side wall 11 is the same as the shape of a cross-section of a region formed between an inner wall of the shield side wall 11 and an outer wall of the sub-shield side wall 21. For example, as shown in FIG. 5, the shield side wall 11 is peripherally closed to form a larger cuboid and the sub-shield side wall 21 is peripherally closed to form a smaller cuboid. The shape of the surface of the shield top plate facing the shield side wall 11 is the same as the shape of a cross-section of a region formed between an inner wall of the shield side wall 11 and an outer wall of the sub-shield side wall 21. For example, the shape of the surface of the shield top plate facing the shield side wall 11 is the same as a region that is peripherally closed and formed by removing a smaller rectangle corresponding to the cross-section of the sub-shield side wall 21 from a larger rectangle corresponding to the cross-section of the shield side wall 11, e.g., the region 70 in FIG. 7G. In some embodiments, the shield side wall 11 and the sub-shield side wall 21 are each hermetically connected to the shield top plate. In some embodiments, the shield top plate may be a ceiling of the examination room or a shield independent of the ceiling of the examination room (e.g., the shield top plate may be a shield embedded in the ceiling of the examination room).

In some embodiments, as shown in FIG. 1, the examination room shield 100 may also include a shield base plate 12. The shield base plate 12 refers to a shield underneath the outermost perimeter of the examination room shield. The shield base plate 12 serves a similar purpose and material as the shield side wall 11. The shape of a surface of the shield base plate 12 facing the shield side wall 11 is similar to the shape of the shield top plate, and is not described herein. In some embodiments, the shield side wall 11 and the sub-shield side wall 21 are each hermetically connected to the shield base plate 12. In some embodiments, the shield base plate 12 may be a floor of the examination room or a shield independent of the floor of the examination room (e.g., the shield base plate 12 may be a shield embedded in the floor of the examination room).

Figure 2:
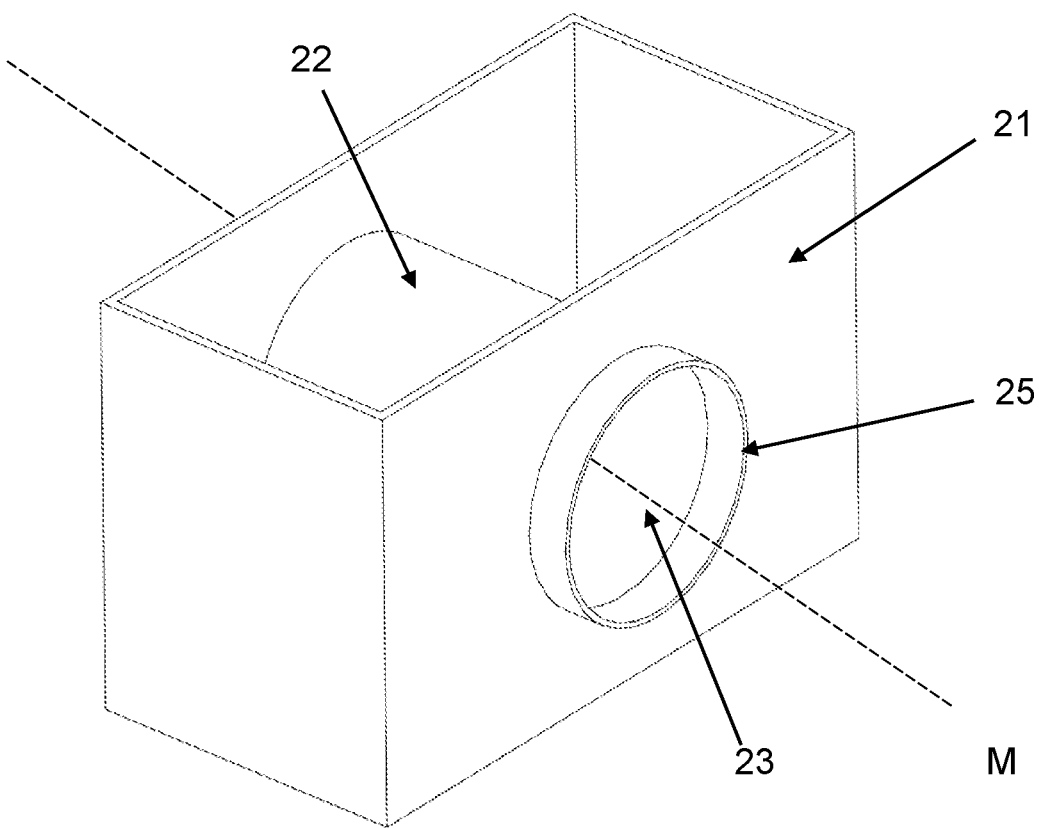
FIG. 2 is an exemplary structural diagram illustrating a sub-shield assembly according to some embodiments of the present disclosure.

FIG. 2 is an exemplary structural diagram illustrating a sub-shield assembly according to some embodiments of the present disclosure.

The sub-shield assembly 20 refers to a shield assembly provided in an internal space enclosed by the shield side wall 11. As shown in FIG. 2, the sub-shield assembly 20 includes a peripherally closed sub-shield side wall 21 and a hollow sub-shield 22 disposed inside the sub-shield assembly 20, and upper and lower ends of the sub-shield side wall 21 are respectively hermetically connected to the shield top plate and the shield base plate 12. It can be understood that the peripherally closed sub-shield side wall 21 shown in FIG. 2 includes four rectangles connected head to tail. The sub-shield side wall 21 is disposed with at least one opening 23, and the sub-shield 22 is hermetically connected to the at least one opening 23 of the sub-shield assembly 20. In some embodiments, two openings 23 with the same shape and size may be disposed oppositely on the sub-shield side wall 21.

Figure 4:
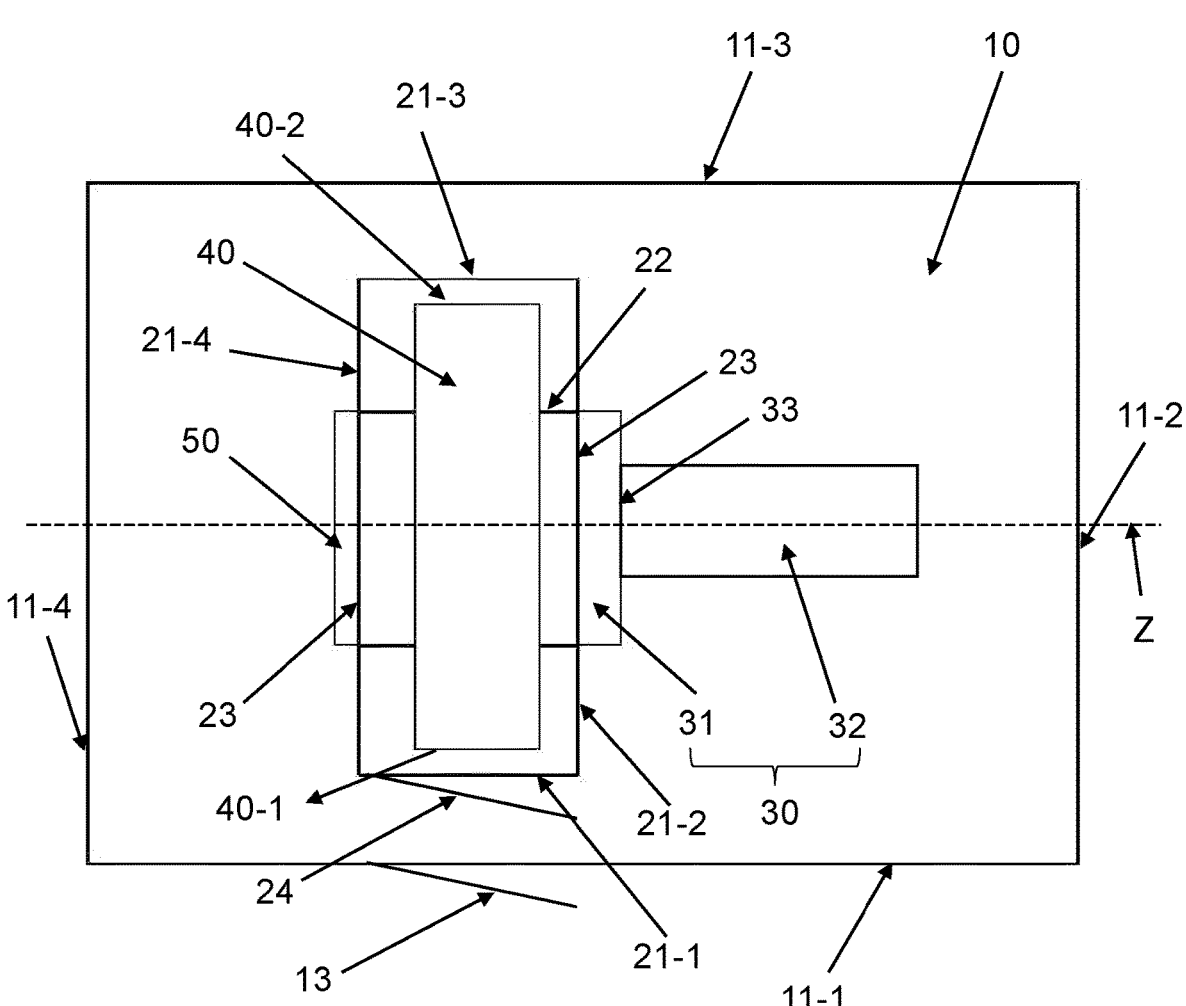
FIG. 4 is an exemplary top diagram illustrating an examination room shield according to some embodiments of the present disclosure.

For example, two openings 23 may be respectively disposed on a second sub-shield surface 21-2 and a fourth sub-shield surface 21-4 (as shown in FIG. 4) of the sub-shield side wall 21. In some embodiments, the sub-shield side wall 21 may be provided with only one opening 23. For example, the sub-shield side wall 21 may be provided with only one opening 23 that is disposed on the second sub-shield surface 21-2.

In some embodiments, the sub-shield 22 may be a hollow structure with a hollow space. The cross-sections (vertical to the M direction in FIG. 2 that is the extending direction of the sub-shield 22) of the sub-shield 22 and the hollow space may be of any shape, e.g., circular, square, etc. The shapes of the cross-sections of the sub-shield 22 and the hollow space may be the same or different. The hollow space is internally used for installing the MRI device 30. In some embodiments, the material of the sub-shield assembly 20 may include a copper foil or a galvanized steel sheet. In some embodiments, the size and the shape of the opening 23 may be configured so that the sub-shield 22 is able to be installed in the opening 23. In some embodiments, the shape of the opening 23 may be different from or the same as the cross-section of the sub-shield 22. For example, the opening 23 is circular and the cross-section of the sub-shield 22 is circular, and the diameter of the opening 23 may be equal to or greater than the outer diameter of the sub-shield 22. As another example, the opening 23 is square and the cross-section of the sub-shield 22 is circular, and the side length of the opening 23 may be equal to or greater than the outer diameter of the sub-shield 22. In some embodiments, the size and the shape of the hollow space of the sub-shield 22 may be configured so that the MRI device is able to be installed in the hollow space of the sub-shield 22. In some embodiments, the hollow space of the sub-shield 22 may 22 may be cylindric, cubic, or other shapes. For example, the hollow space of the sub-shield 22 is a cylinder, and the diameter of the sub-shield 22 may be equal to or greater than the size of the MRI device (e.g., the outer diameter of the main magnet of the MRI device that is a cylinder). As another example, the hollow space of the sub-shield 22 is a cube, and the side length of the sub-shield 22 may be equal to or greater than the size of the MRI device (e.g., the outer diameter of the main magnet of the MRI device that is a cylinder)).

In some embodiments, referring to FIG. 4, the MRI device 30 may include a main magnet 31 and a movable bed 32. The main magnet 31 is in the shape of a hollow cylinder. The main magnet 31 may be coaxially disposed within the sub-shield 22. The cylindrical shape has any suitable cross-section including a circular or elliptical cross-section. The movable bed 32 may be moved into or out of a bore 33 of the main magnet 31 to enable imaging of a patient on the movable bed 32. The bore 33 is a scanning region of the MRI device 30.

In some embodiments, the sub-shield 22 may be a housing of the main magnet 31 that is an electromagnetic shielding material. In some embodiments, the housing of the main magnet 31 may be a conductive metallic copper or stainless steel plate, and the housing of the main magnet 31 may be used as the sub-shield 22 to hermetically connected to the sub-shield side wall 21.

Figure 6:
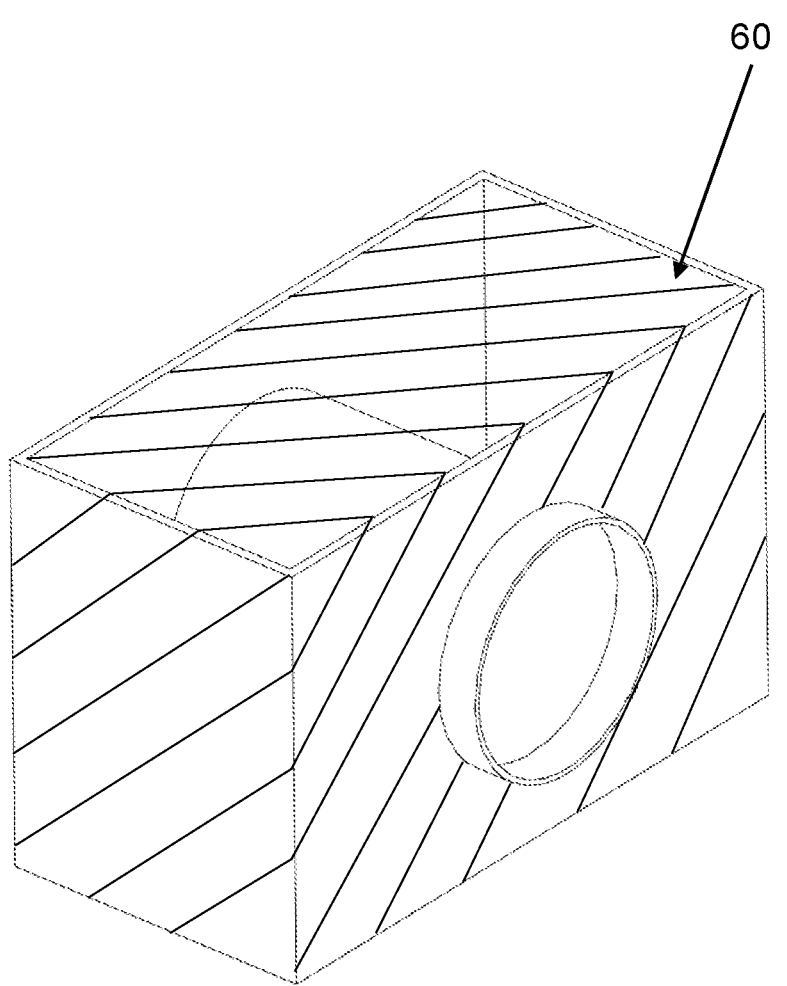
FIG. 6 is an exemplary structural diagram illustrating a second shield space according to some embodiments of the present disclosure.

In some embodiments, the sub-shield side wall 21 may be connected to the sub-shield 22 (e.g., the housing of the main magnet 31) via a connection member 50 to form a hermetic space, i.e., a second shield space 60 shown in FIG. 6 formed by the inner wall of the sub-shield side wall 21 and the outer wall of the sub-shield 22.

In some embodiments, referring to FIG. 1, the housing of the main magnet 31 may be cylindrical or subcylindrical, and the shape and size of the opening 23 of the sub-shield side wall 21 may be the same as the shape and the size of the housing of the main magnet 31. The connection member 50 may be a side wing 25 extending along the M direction from the opening 23 to the outside of the sub-shield side wall 21, which is formed as a part of the sub-shield side wall 21 and may be formed by integrated molding. A profile of the side wing 25 is connected to the opening 23, and since the opening 23 is on the sub-shield side wall 21, the connection to the opening 23 may be equivalent to a connection to the sub-shield side wall 21. Referring to FIG. 2, the side wing 25 is perpendicular to an end surface of the sub-shield side wall 21. The end surface of the sub-shield side wall 21 herein refers, as shown in FIG. 4, to a surface of the sub-shield side wall 21 that is vertical to the M direction, i.e., a second sub-shield side 21-2 and a fourth sub-shield side 21-4 in FIG. 4. In some embodiments, the side wing 25 may be an annulus peripherally closed around and extending along the M direction. A cross-section of the side wing 25 has the same shape and dimension as the shape and dimension of the opening 23. The cross-section of the side wing 25 is perpendicular to the M direction. In some embodiments, when the count of the openings 23 is two, each opening 23 is connected with one side wing 25. The main magnet 31 of the MRI device extends through the opening 23 at one end of the sub-shield side wall 21 (e.g., the second sub-shield side 21-2 in FIG. 4) and the opening 23 at the other end of the sub-shield side wall 21 (e.g., the fourth sub-shield side 21-4 in FIG. 4), and the sub-shield sidewall 21 and the housing of the main magnet 31 are hermetically and electrically conductively connected via the two side wings 25. In some embodiments, the side wing 25 is hermetically connected to the housing of the main magnet 31 by welding or riveting, etc. The connection between the housing of the main magnet 31 and the side wing 25 is preferably welded, with a good airtight effect, to ensure that the second shield space 60 formed by the combined enclosure of the sub-shield side wall 21 and the housing of the main magnet 31 has a better shielding performance.

Figure 3:
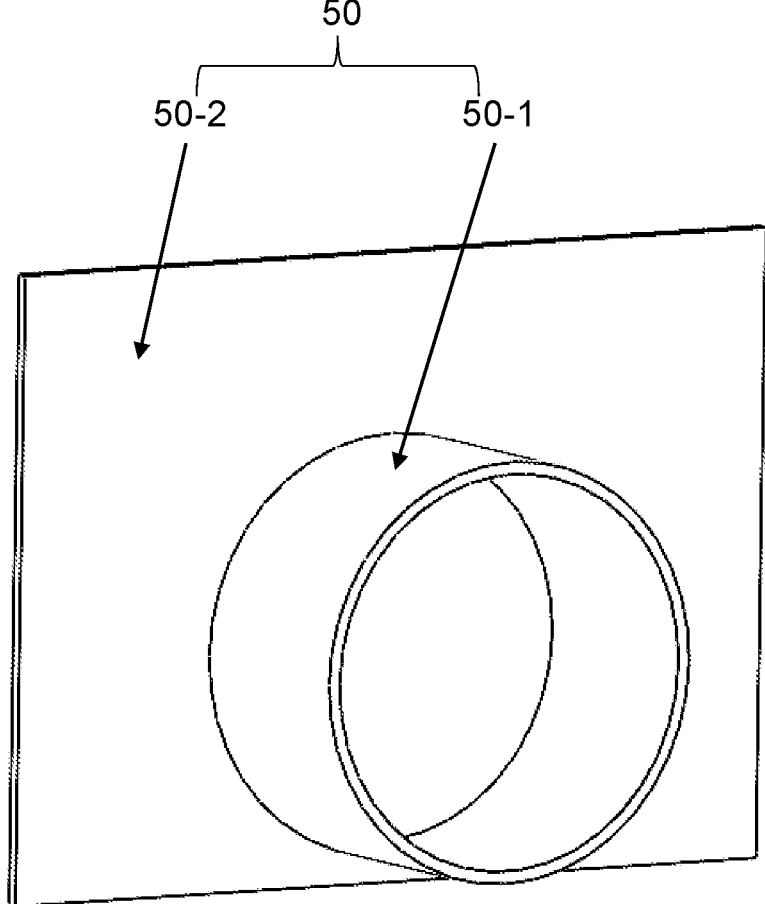
FIG. 3 is an exemplary structural diagram illustrating a connection member of an examination room shield according to some embodiments of the present disclosure.

FIG. 3 is an exemplary structural diagram illustrating a connection member of an examination room shield according to some embodiments of the present disclosure.

In some embodiments, as shown in FIG. 3, the connection member 50 may be a separate part. The connection member 50 has a folded edge. A first folded edge 50-1 is hermetically connected to the housing of the main magnet 31, and a second folded edge 50-2 is hermetically connected to the end surface of the sub-shield sidewall 21. In some embodiments, the shape and dimension of the first folded edge 50-1 are similar to the shape and dimension of the side wing 25 and are not described herein. The second folded edge 50-2 may be an annulus peripherally closed around the M direction and parallel to the end surface of the sub-shield side wall 21. A cross-section of the second folded edge 50-2 is an annularly closed connecting space. The shape and dimension of an inner boundary of the cross-section are the same as the shape and dimension of the opening 23; the shape of an outer boundary of the cross-section may be a shape of a circle, a square, an irregular shape, etc., with a dimension larger than the dimension of the opening 23. A cross-section of the second folded edge 50-2 is perpendicular to the M direction. In some embodiments, an angle between the first folded edge 50-1 and the second folded edge 50-2 may be 90°. As shown in FIG. 1, when the housing of the main magnet 31 is perpendicular to the end surface of the sub-shield side wall 21, the angle between the first folded edge 50-1 and the second folded edge 50-2 of the connection member 50 is 90°. In some embodiments, when the housing of the main magnet 31 is tapered, the angle between the first folded edge 50-1 and the second folded edge 50-2 of the connection member 50 may be an acute or obtuse angle matching the tapered surface of the housing of the main magnet 31.

In some embodiments, the shape and size of the opening 23 of the sub-shield side wall 21 may also be different from the shape and size of the housing of the main magnet 31. For example, the housing of the main magnet 31 is a cylinder while the opening 23 is square. A profile of the opening 23 is larger than a profile of the housing of the main magnet 31, ensuring that the housing of the main magnet 31 passes through the sub-shield side wall 21 through the opening 23. For example, the side length of the square opening 23 may be larger than the outer diameter of the cylindrical housing of the main magnet 31. The embodiment employs a separate connection member 50 to hermetically connect the housing of the main magnet 31 to the sub-shield side wall 21.

In some embodiments, the sub-shield 22 may include a peripherally closed side wall and the connection member 50. The peripherally closed side wall includes a first end and a second end along the M direction. The first end may be hermetically connected to the connection member 50, and the first end of the peripherally closed side wall of the sub-shield 22 and the connection member 50 are hermetically connected to the opening 23 at one end of the sub-shield side wall 21 (e.g., the second sub-shield side 21-2 in FIG. 4). The second end may be hermetically connected to the opening 23 at the other end of the sub-shield side wall 21 (e.g., the fourth sub-shield side 21-4 in FIG. 4).

In some embodiments, referring to FIG. 4, two openings 23 are disposed on opposite sides lateral to the sub-shield side wall 21. The sub-shield 22 may include a peripherally closed side wall, and both ends of the sub-shield 22 along the M direction are hermetically connected to the two openings 23 of the sub-shield assembly 20, respectively. In some embodiments, the hermetic connection may be formed using integrated molding. In some embodiments, the aforementioned hermetic connection may be formed using a fixed connection (e.g., welding, riveting, etc.) of the two ends of the sub-shield 22 along the M direction to the two openings 23 of the sub-shield assembly 20.

FIG. 5 is an exemplary structural diagram illustrating a first shield space according to some embodiments of the present disclosure.

In some embodiments, when the shapes of the shield top plate and the shield base plate 12 are the same as the shape of the cross-section of the shield side wall 11, the shield side wall 11, the shield top plate, and the shield base plate 12 are combined to form a hermetic first shield space 10. The sub-shield assembly 20 is disposed within the first shield space 10. For example, if the shield side wall 11 is peripherally closed to form a cuboid profile, the first shield space 10 is a cuboid enclosed by the shield side wall 11, the shield top plate, and the shield base plate 12 together. In some embodiments, as shown in FIG. 5, when the shapes of the shield top plate and the shield base plate 12 are the same as the shape of the cross-section of the region enclosed by the inner wall of the shield side wall 11 and outer wall of the sub-shield side wall 21, the shield side wall 11, the sub-shield side wall 21, the sub-shield 22, the shield top plate, and the shield base plate 12 together form a hermetic first shield space 10. The first shield space 10 may include a space 70 that is peripherally closed and a space inside the sub-shield 22 (for installing the MRI device 30). By wrapping the MRI device inside the first shield space, signal interference to the MRI device from outside of the examination room can be effectively prevented.

In some embodiments, when the shapes of the shield top plate and the shield base plate 12 are the same as the shape of the cross-section of the shield side wall 11, the inner wall of the peripherally closed sub-shield side wall 21, the outer wall of the sub-shield 22, the shield top plate, and the shield base plate 12 are combined to form the hermetic second shield space 60. By wrapping the additional device 40 inside the second shield space 60, electromagnetic interference generated by the additional device can be effectively shielded to ensure that the MRI device operates in a space with on electromagnetic interference or very weak electromagnetic interference. In some embodiments, as shown in FIG. 6, when the shapes of the shield top plate and the shield base plate 12 are the same as the shape of the cross-section of the region enclosed by the inner wall of the shield side wall 11 and the outer wall of the sub-shield sidewall 21, the peripherally closed sub-shield side wall 21 and the sub-shield 22 are combined to form the second shield space 60. It can be understood that the second shield space 60 is not hermetic at this case, but since the shield side wall 11, the sub-shield side wall 21, the sub-shield 22, the shield top plate, and the shield base plate 12 are enclosed to form the hermetic first shield space 10 in which, the MRI device is wrapped, when the additional device 40 is wrapped inside the second shield space 60, the electromagnetic interference generated by the additional device can also be effectively shielded to ensure that the MRI device operates in a space with on electromagnetic interference or very weak electromagnetic interference.

In some embodiments, the hollow space of the sub-shield 22 is used for installing the MRI device 30 and the second shield space 60 is used for installing the additional device 40, with the additional device 40 located on an outside of the sub-shield 22.

The additional device 40 is a device that can be used for imaging or treatment. In some embodiments, the additional device 40 may include a radiation therapy (RT) device or other types of therapy devices. For example, the RT device may include a 60 cobalt therapy device, a linear accelerator, a neutron accelerator. In some embodiments, the additional device 40 may include a computed tomography (CT) device, an X-ray imaging device, a positron emission tomography (PET) device, or other types of imaging devices.

In some embodiments, the additional device 40 may be an annular device or a C-arm device, and the additional device 40 may be rotatable around axis Z. The MRI device may be rotatable around its own rotation axis. In some embodiments, when the additional device 40 and the MRI device are placed inside the examination room shield 100, the axis Z of the additional device 40, the axis M of the sub-shield 22, and the rotation axis of the MRI device are parallel or coincident.

FIG. 4 is an exemplary top diagram illustrating an examination room shield according to some embodiments of the present disclosure.

In some embodiments, the shield side wall 11 and the sub-shield side wall 21 may form a connected space 70 that is peripherally closed and used as an operating room for the MRI device 30. In some embodiments, referring to FIG. 4, the shield side wall 11 and the sub-shield side wall 21 may be peripherally closed to respectively form a cuboid space when viewed from a top perspective. The shield side wall 11 includes a first shield surface 11-1, a second shield surface 11-2, a third shield surface 11-3, and a fourth shield surface 11-4 to form a larger cuboid. The sub-shield side wall 21 includes a first sub-shield surface 21-1, a second sub-shield surface 21-2, a third sub-shield surface 21-3, and a fourth sub-shield surface 21-4 to form a smaller cuboid. The first shield surface 11-1, the third shield surface 11-3, the first sub-shield surface 21-1, and the third sub-shield surface 21-3 are parallel to each other. The second shield surface 11-2, the fourth shield surface 11-4, the second sub-shield surface 21-2, and the fourth sub-shield surface 21-4 are parallel to each other. The inner wall of the shield side wall 11 and the outer wall of the sub-shield side wall 21 may form the connected space 70 that is peripherally closed.

In some embodiments, the shield side wall 11 may be peripherally closed to form a circumferential closed shape such as a cylindrical profile, a cubic profile, or a cuboid profile. The peripherally closed shape is a closed shape formed around the east, south, west, north, for example, a cylindrical side wall, a cubic side wall, or a cuboid side wall, etc. are peripherally closed shapes. In some embodiments, the peripherally closed shield side wall 11 may be formed using integrated molding. In some embodiments, the peripherally closed shield sidewall 11 may be formed using a plurality of shield surfaces (e.g., the first shield surface 11-1, the second shield surface 11-2, the third shield surface 11-3, and the fourth shield surface 11-4) fixedly connected (e.g., welded, riveted, etc.) head to tail.

In some embodiments, the sub-shield side wall 21 may be peripherally closed to form a peripherally closed shape such as a cylindrical profile, a cubic profile, or a cuboid profile. The processing of the peripherally closed sub-shield side wall 21 is similar to the processing of the peripherally closed shield side wall 11 and is not described herein.

FIGS. 7A-FIG. 7I are exemplary top diagrams illustrating a shield side wall and a sub-shield side wall according to some embodiments of the present specification. In some embodiments, a peripherally closed space 70 may be formed between the shield side wall 11 and the sub-shield side wall 21. The peripherally closed space 70 may be formed between the inner wall of the shield side wall 11 and the outer wall of the sub-shield side wall 21. The space enclosed by the sub-shield side wall 21 and the hollow space of the sub-shield 22 do not belong to the space 70.

As shown in FIG. 7A, from a top diagram perspective, the shield side wall 11 forms a larger circle and the sub-shield side wall 21 forms a smaller circle located within the shield side wall 11. A connected space 70 that is peripherally closed is formed between the larger circle formed by the shield side wall 11 and the smaller circle formed by the sub-shield sidewall 21, i.e., a region formed by removing the smaller circle from the larger circle. As shown in FIG. 7B, from a top diagram perspective, the shield side wall 11 forms a larger circle and the sub-shield side wall 21 forms a smaller square located within the shield side wall 11. A connected space 70 that is peripherally closed is formed between the larger circle formed by the shield side wall 11 and the smaller square formed by the sub-shield sidewall 21, i.e., a region formed by removing the smaller square from the larger circle. As shown in FIG. 7C, from a top diagram perspective, the shield side wall 11 forms a larger circle and the sub-shield side wall 21 forms a smaller rectangle located within the shield side wall 11. A connected space 70 that is peripherally closed is formed between the larger circle formed by the shield side wall 11 and the smaller rectangle formed by the sub-shield sidewall 21, i.e., a region formed by removing the smaller rectangle from the larger circle. As shown in FIG. 7D, from a top diagram perspective, the shield side wall 11 forms a larger square and the sub-shield side wall 21 forms a smaller square located within the shield side wall 11. A connected space 70 that is peripherally closed is formed between the larger square formed by the shield side wall 11 and the smaller square formed by the sub-shield sidewall 21, i.e., a region formed by removing the smaller square from the larger square. As shown in FIG. 7E, from a top diagram perspective, the shield side wall 11 forms a larger square and the sub-shield side wall 21 forms a smaller circle located within the shield side wall 11. A connected space 70 that is peripherally closed is formed between the larger square formed by the shield side wall 11 and the smaller circle formed by the sub-shield sidewall 21, i.e., a region formed by removing the smaller circle from the larger square. As shown in FIG. 7F, from a top diagram perspective, the shield side wall 11 forms a larger square and the sub-shield side wall 21 forms a smaller rectangle located within the shield side wall 11. A connected space 70 that is peripherally closed is formed between the larger square formed by the shield side wall 11 and the smaller rectangle formed by the sub-shield sidewall 21, i.e., a region formed by removing the smaller rectangle from the larger square. As shown in FIG. 7G, from a top diagram perspective, the shield side wall 11 forms a larger rectangle and the sub-shield side wall 21 forms a smaller rectangle located within the shield side wall 11. A connected space 70 that is peripherally closed is formed between the larger rectangle formed by the shield side wall 11 and the smaller rectangle formed by the sub-shield sidewall 21, i.e., a region formed by removing the smaller rectangle from the larger rectangle. As shown in FIG. 7H, from a top diagram perspective, the shield side wall 11 forms a larger rectangle and the sub-shield side wall 21 forms a smaller circle located within the shield side wall 11. A connected space 70 that is peripherally closed is formed between the larger rectangle formed by the shield side wall 11 and the smaller circle formed by the sub-shield sidewall 21, i.e., a region formed by removing the smaller circle from the larger rectangle. As shown in FIG. 7I, from a top diagram perspective, the shield side wall 11 forms a larger rectangle and the sub-shield side wall 21 forms a smaller square located within the shield side wall 11. A connected space 70 that is peripherally closed is formed between the larger rectangle formed by the shield side wall 11 and the smaller square formed by the sub-shield sidewall 21, i.e., a region formed by removing the smaller square from the larger rectangle.

In some embodiments, from a top diagram perspective, when the shield side wall 11 and the sub-shield side wall 21 have the same shape (e.g., as shown in FIGS. 7A, 7D, and 7G), the spacing between the shield side wall 11 and the sub-shield side wall 21 may be equally spaced. The equal spacing means that the distances between each point on the sub-shield side wall 21 and the shield side wall 11 are equal. For any point on the sub-shield side wall 21, the distance between the point and the shield side wall 11 is a shortest distance among the distances between the point and the points on the shield side wall 11. It can be understood that if the shield side wall 11 is a plane, the distance between the point on the sub-shield side wall 21 and the shield side wall 11 is a vertical distance from the point to the shield side wall 11. In some embodiments, the spacing between the shield side wall 11 and the sub-shield side wall 21 may be designed to be non-equally spaced based on actual use, e.g., since operations on the MRI device 30 and/or the addition device 40 are more on the side (e.g., the front side of the MRI device 30 and/or the addition device 40) where the movable bed is located, requiring a larger space, the space corresponding to the side where the movable bed is located may be set at a larger spacing, and other positions may be set at a smaller spacing.

In some embodiments, from a top diagram perspective, the shield side wall 11 and the sub-shield side wall feid 21 may be disposed concentrically (e.g., as shown in FIGS. 7A-7I) to improve the evenness and the symmetry of the space 70. In some embodiments, the shield side wall 11 and the sub-shield side wall 21 may be disposed non-concentrically. For example, as shown in FIG. 4, the sub-shield side wall 21 is disposed closer to the fourth shield surface compared to the third shield surface, so as to leave more operation space on the front side of the MRI device 30 and/or the addition device 40.

In some embodiments, referring to FIG. 4, from a top diagram perspective, the connected space 70 that is peripherally closed formed between the shield side wall 11 and the sub-shield side wall 21 may be used as an operating space of the MRI device 30, allowing for a certain operating space around the MRI device 30 and a larger operating space for an operator (e.g., a doctor, a technician, or an engineer). The annular space is provided with an annular passage for the operator to walk around, and the annular passage enables the operator to have more walking paths, which facilitates the operator to quickly respond to unexpected conditions of the patient during the operation of the device. It can be understood that there is no operator in the annular space when the MRI device 30 and the additional device 40 are working; when the work of the MRI device 30 and the additional device 40 is completed or during the working gap of the MRI device 30 and the additional device 40, there can be an operator in the annular space for operation.

In some embodiments, at least one side lateral to the shield side wall 11, or at least one side lateral to the sub-shield side wall 21 is disposed with a movable door. The side lateral to the shield side wall 11 refers to the first shield surface 11-1 and/or the third shield surface 11-3 that is parallel to the axis M (when the additional device 40 is placed inside the second shield space 60 enclosed by the sub-shield side wall 21, the axis Z of the additional device 40 and the axis M of the sub-shield 22 are parallel or coincident). A direction between the first shield surface 11-1 and the third shield surface 11-3 is vertical to the axis M. The side lateral to the sub-shield side wall 21 refers to the first sub-shield surface 21-1 and/or the third sub-shield surface 21-3 that is parallel to the axis M. A direction between the first sub-shield surface 21-1 and the third sub-shield surface 21-3 is vertical to the axis M. In some embodiments, referring to FIG. 4, the shield side wall 11 and the sub-shield side wall 21 may both be cuboid. Two movable doors may be disposed on the first shield surface 11-1 of the shield side wall 11 and the first sub-shield surface 21-1 of the sub-shield side wall 21, respectively. In some embodiments, as shown in FIGS. 7A-7C, 7E, and 7H, the shield side wall 11 and/or the sub-shield side wall 21 may be circular when viewed from a top-down perspective, and the movable door on the shield side wall 11 and/or the sub-shield side wall 21 may be a portion of the circular shape.

In some embodiments, at least one side lateral to the sub-shield side wall 21 may be provided with a first movable door 24. In some embodiments, the first sub-shield surface 21-1 (as shown in FIG. 4) or the first sub-shield surface 21-3 of the sub-shield side wall 21 is disposed with the first movable door 24. The first movable door 24 is provided on a side lateral to the additional device 40 surrounded by the sub-shield side wall 21. The side lateral to the additional device 40, in this context, refers to a first surface 40-1 and/or a second surface 40-2 that is parallel to the axis Z of the additional device 40. A direction between the first surface 40-1 and the second surface 40-2 is vertical to the axis Z (a rotation axis of the additional device 40). When the first movable door 24 is open, it facilitates maintenance or repair of the additional device 40 within the second shield space 60. When the first movable door 24 is closed, the first movable door 24 is hermetically connected to the sub-shield side wall 21 to ensure the shielding performance of the second shield space 60, which in turn ensures that the MRI device 30 operates without being interfered with by signals from the additional device 40 within the second shield space 60. A first movable door on the sub-shield side wall may be located corresponding to the first surface or the second surface of the addition device. For example, as shown in FIG. 4, the first movable door 24 may be provided on the first sub-shield surface 21-1 of the sub-shield side wall 21, corresponding to the first surface 40-1 of the addition device (e.g., the first sub-shield surface 21-1 and the first surface 40-1 are located on the same side of the axis Z). As another example, a first movable door may be provided on the third sub-shield surface 21-3 of the sub-shield side wall 21, corresponding to the second surface 40-2 of the addition device (e.g., the third sub-shield surface 21-3 and the second surface 40-2 are located on the same side of the axis Z).

In some embodiments, the sub-shield side wall 21 (e.g., the first sub-shield surface 21-1 and the third sub-shield surface 21-3) is disposed with two first movable doors 24 on both sides lateral to the additional device 40 (no diagram is given for this embodiment), and the two first movable doors 24 are disposed on both sides lateral to the additional device 40, respectively. The two sides lateral to the additional device 40 are left and right sides lateral to the additional device as viewed from a side lateral to the opening 23. As shown in FIG. 4, the two sides lateral to the additional device 40 are the first surface 40-1 and the second surface 40-2. The two first movable doors 24 on both sides lateral to the sub-shield side wall 21 may be opened at the same time, which facilitates a plurality of workers to carry out maintenance or repair of the additional device 40 in the second shield space 60 at the same time through different locations, which increases the maintenance space and reduces the difficulty of maintenance. The sub-shield side wall 21 may be disposed with two first movable doors located corresponding to the first surface 40-1 and the second surface 40-2 of the additional device 40, respectively. For example, a first movable doors may be provided on the first sub-shield surface 21-1 of the sub-shield side wall 21, corresponding to the first surface 40-1 of the addition device (e.g., the first sub-shield surface 21-1 and the first surface 40-1 are located on the same side of the axis Z), and another first movable doors may be provided on the third sub-shield surface 21-3 of the sub-shield side wall 21, corresponding to the second surface 40-2 of the addition device (e.g., the third sub-shield surface 21-3 and the second surface 40-2 are located on the same side of the axis Z).

In some embodiments, at least one side lateral to the shield side wall 11 may be provided with a second movable door 13. In some embodiments, the second movable door 13 is located on the first shield surface 11-1 (as shown in FIG. 4) or the third shield surface 11-3 of the shield side wall 11. The second movable door 13 is provided on a side lateral to the additional device 40 enclosed inside the sub-shield 22, e.g., the first surface 40-1 or the second surface 40-2. When the second movable door 13 is open, it facilitates access to the examination room for patients and operators. When the second movable door 13 is closed, the second movable 13 is hermetically connected to the shield side wall 11 to ensure the shielding performance of the first shield space 10, which in turn ensures that the MRI device 30 operates without being interfered with by signals from outside the examination room.

In some embodiments, referring to FIG. 4, the second movable door 13 on the shield side wall 11 and the first movable door 24 on the sub-shield side wall 21 are located in a same direction relative to the additional device 40. The structure is designed to facilitate maintenance or repair of the additional device 40, e.g., when the additional device 40 needs maintenance or repair, the first movable door 24 and the second movable door 13 are opened at the same time, and a maintenance worker can place a maintenance device of a relatively large size outside of the examination room, which facilitates the maintenance worker to use the large-scale maintenance device to carry out maintenance of the additional device 40. In some embodiments, the second movable door 13 on the shield side wall 11 and the first movable door 24 on the sub-shield side wall 21 may be located in different orientations relative to the additional device 40.

In some embodiments, the movable door may be a sliding door or a revolving door. The present disclosure does not limit the structure of the movable door, and when the movable door is closed, the movable door forms an integral part of the corresponding shield side wall to ensure the shielding performance of the first shield space and the second shield space 60.

Some embodiments of the present disclosure provide a magnetic resonance imaging (MRI) system comprising an examination room including an examination room shield 100 and an MRI device 30. The MRI device 30 is installed within a hollow space of a sub-shield 22 of the examination room shield 100. Referring to FIG. 4, the MRI device 30 includes a main magnet 31 and a movable bed 32. The main magnet 31 is in the shape of a hollow cylinder, and the main magnet 31 is coaxially disposed within the sub-shield 22. The movable bed 32 is movable in a bore in the main magnet 31 to enable imaging examination of a patient on the movable bed 32. The examination room has an examination room shield 100 as described in any of the above embodiments to ensure that the MRI device 30 operates with no electromagnetic interference or very weak electromagnetic interference.

Some embodiments of the present disclosure provide an imaging system comprising: an examination room shield 100 described in any of the above embodiments, a magnetic resonance imaging device (MRI) 30, and an additional device 40 disposed outside of the sub-shield 22. Referring to the description above in the present disclosure, the MRI device 30 is wrapped inside the first shield space 10, and the additional device 40 is wrapped inside the second shield space 60, which not only effectively prevents signal interference to the MRI device from the outside of the examination room, but also shields electromagnetic interference generated by the additional device 40, so as to ensure that the MRI device 30 is operated in a space with no electromagnetic interference or very weak electromagnetic interference. When the additional device 40 is a treatment device such as a radiotherapy device, the imaging system enables a patient to be treated by the additional device 40 at the same time as the MRI, in order to realize accurate localization and treatment of the patient's lesion. When the additional device 40 is a diagnostic device, the imaging system enables the patient to be treated with diagnostics through the additional device 40 while the MRI is being performed to achieve accurate localization of the patient's lesion.

In some embodiments, a first medical device may be placed in the first shield space 10 and a second medical device may be placed in the second shield space 60, where the first medical device operates with higher anti-interference requirements. The first medical device and the second medical device may be the same device or different devices, and the first medical device and the second medical device may also be medical devices other than those described herein.

Beneficial effects that may be brought about by embodiments of the present disclosure include the followings. (1) A separate second shield space is disposed within a first shield space, i.e., effectively preventing signal interference to the MRI device from outside of the examination room, and shielding the electromagnetic interference generated by the additional device, so as to ensure that the MRI device is operated in a space with on electromagnetic interference or very weak electromagnetic interference. (2) The connecting annular operating room within the examination room allows the operator to operate in a larger space. (3) The annular walkway set up in the annular space for the operator to walk around provides more walkways and facilitates the operator to quickly respond to unexpected patient conditions during the operation of the device. (4) The design of the movable door facilitates the maintenance or repair of the additional device.

The basic concepts have been described above, apparently, in detail, as will be described above, and does not constitute limitations of the disclosure. Although there is no clear explanation here, those skilled in the art may make various modifications, improvements, and modifications of present disclosure. This type of modification, improvement, and corrections are recommended in present disclosure, so the modification, improvement, and the amendment remain in the spirit and scope of the exemplary embodiment of the present disclosure.

At the same time, present disclosure uses specific words to describe the embodiments of the present disclosure. As "one embodiment", "an embodiment", and/or "some embodiments" means a certain feature, structure, or characteristic of at least one embodiment of the present disclosure. Therefore, it is emphasized and should be appreciated that two or more references to "an embodiment" or "one embodiment" or "an alternative embodiment" in various parts of present disclosure are not necessarily all referring to the same embodiment. Further, certain features, structures, or features of one or more embodiments of the present disclosure may be combined.

In addition, unless clearly stated in the claims, the order of processing elements and sequences, the use of numbers and letters, or the use of other names in the present disclosure are not used to limit the order of the procedures and methods of the present disclosure. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

In some embodiments, the numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters used in the specification and claims are approximate values, and the approximation may change according to the characteristics required by the individual embodiments. In some embodiments, the numerical parameter should consider the prescribed effective digits and adopt a general digit retention method. Although in some embodiments, the numerical fields and parameters used to confirm the breadth of its range are approximate values, in specific embodiments, such numerical values are set as accurately as possible within the feasible range.

At last, it should be understood that the embodiments described in the present disclosure are merely illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. An examination room shield, comprising:
a peripherally closed shield side wall, and
a sub-shield assembly disposed in an inner space enclosed by the shield side wall;
the sub-shield assembly including a peripherally closed sub-shield side wall;
wherein the shield side wall and the sub-shield assembly are used to shield electromagnetic interference.

2. The examination room shield of claim 1, further comprising:
a shield top plate corresponding to the shield side wall, wherein a shape of a surface of the shield top plate facing the shield side wall is the same as a shape of a cross-section of a region formed between an inner wall of the shield side wall and an outer wall of the sub-shield side wall.

3. The examination room shield of claim 1, wherein the sub-shield assembly further includes a hollow sub-shield extending horizontally, the hollow sub-shield includes two ends along an extending direction of the hollow sub-shield, the sub-shield side wall is hermetically connected to the two ends of the hollow sub-shield, and the hollow sub-shield is used to shield electromagnetic interference.

4. The examination room shield of claim 3, wherein the sub-shield side wall is provided with an opening, the hollow space in the hollow sub-shield is connected with the sub-shield side wall through the opening;

a size and a shape of the opening are configured so that the hollow sub-shield is able to be installed in the opening.

5. The examination room shield of claim 3, wherein
a space within the sub-shield side wall is divided into two parts by the sub-shield side wall and the hollow sub-shield hermetically connected with each other, a first part of the two parts is used to install a device with a first modality, a second part of the two parts is used to install a device with a second modality.

6. The examination room shield of claim 5, wherein
the first part is used to install a magnetic resonance imaging (MRI) device, and the second part is used to install a radiotherapy device, so as to shield electromagnetic interference generated by the radiotherapy device to the MRI device.

7. The examination room shield of claim 1, wherein a peripherally closed space is formed between an inner wall of the shield side wall and an outer wall of the sub-shield side wall and used as an operating room for the MRI device.

8. The examination room shield of claim 1, wherein the sub-shield side wall is peripherally closed to form a cylindrical profile, a cubic profile, or a cuboid profile; and/or
the shield side wall is peripherally closed to form a cylindrical profile, a cubic profile, or a cuboid profile.

9. The examination room shield of claim 1, wherein at least one side lateral to the shield side wall or the sub-shield side wall is provided with a movable door.

10. The examination room shield of claim 9, wherein
an additional device surrounded by the sub-shield side wall incudes a first surface and a second surface, and a direction between the first surface and the second surface is vertical to a rotation axis of the additional device; and
a first movable door on the sub-shield side wall is located corresponding to the first surface or the second surface of the addition device.

11. The examination room shield of claim 10, wherein the sub-shield side wall is disposed with two first movable doors located corresponding to the first surface and the second surface of the additional device, respectively.

12. The examination room shield of claim 10, wherein a second movable door on the shield side wall and the first movable door on the sub-shield side wall are located in a same direction relative to the additional device.

13. The examination room shield of claim 1, wherein the sub-shield is a housing for an MRI device.

14. The examination room shield of claim 1, further comprising a shield base plate, the shield side wall and the sub-shield side wall being hermetically connected to the shield base plate, respectively.

15. An imaging system, comprising:
a peripherally closed shield side wall,
a sub-shield assembly disposed in an inner space enclosed by the shield side wall, the sub-shield assembly including a peripherally closed shaped sub-shield side wall; and
an imaging device installed in a space jointly surrounded by the shield side wall and the sub-shield assembly;
wherein the shield side wall and the sub-shield assembly are used to shield electromagnetic interference.

16. The examination room shield of claim 1, wherein the shield side wall is used to limit external electromagnetic interference to an MRI device disposed in the inner space enclosed by the shield side wall, and/or to reduce an impact of electromagnetic radiation generated by the MRI device on an external environment.

17. The examination room shield of claim 1, wherein a material of the shield side wall includes copper or steel, and a material of the sub-shield assembly includes copper or steel.

18. The examination room shield of claim 4, wherein the sub-shield side wall is connected with the hollow sub-shield via a connection member, the connection member is a side wing that includes an annular wall peripherally closed around an extending direction of the hollow sub-shield and extends along the extending direction of the hollow sub-shield from the opening to an outside of the sub-shield side wall, and the annular wall of the side wing is perpendicular to a surface of the sub-shield side wall; or the connection member includes a first folded edge hermetically connected to the hollow sub-shield, and a second folded edge hermetically connected to a surface of the sub-shield side wall; the first folded edge includes an annular wall peripherally closed around an extending direction of the hollow sub-shield and extends outward along the extending direction of the hollow sub-shield from the second folded edge, and the annular wall of the first folded edge is at a certain angle with the second folded edge.

19. The examination room shield of claim 7, wherein the peripherally closed space is provided with an annular passage for an operator to walk around.

20. The imaging system of claim 15, wherein a continuous rectangular annular passage is formed between the shield side wall and the sub-shield side wall, and the imaging device is installed in a space surrounded by the continuous rectangular annular passage.

\* \* \* \* \*